United States Patent
Prechtl et al.

(10) Patent No.: US 9,142,550 B2
(45) Date of Patent: Sep. 22, 2015

(54) HIGH-VOLTAGE CASCADED DIODE WITH HEMT AND MONOLITHICALLY INTEGRATED SEMICONDUCTOR DIODE

(71) Applicant: Infineon Technologies Austria AG, Villach (AT)

(72) Inventors: Gerhard Prechtl, St. Jakob i. Rosental (AT); Clemens Ostermaier, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 151 days.

(21) Appl. No.: 13/920,621

(22) Filed: Jun. 18, 2013

(65) Prior Publication Data

US 2014/0367700 A1    Dec. 18, 2014

(51) Int. Cl.
| | |
|---|---|
| *H01L 29/872* | (2006.01) |
| *H01L 27/06* | (2006.01) |
| *H01L 21/8234* | (2006.01) |
| *H01L 29/16* | (2006.01) |
| *H01L 29/20* | (2006.01) |
| *H01L 29/778* | (2006.01) |
| *H01L 21/8258* | (2006.01) |
| *H01L 29/417* | (2006.01) |
| *H01L 29/10* | (2006.01) |

(52) U.S. Cl.
CPC ........ *H01L 27/0629* (2013.01); *H01L 21/8234* (2013.01); *H01L 21/8258* (2013.01); *H01L 27/0605* (2013.01); *H01L 29/1075* (2013.01); *H01L 29/1079* (2013.01); *H01L 29/1608* (2013.01); *H01L 29/2003* (2013.01); *H01L 29/4175* (2013.01); *H01L 29/778* (2013.01); *H01L 29/7786* (2013.01); *H01L 29/872* (2013.01); *H01L 2224/48091* (2013.01); *H01L 2224/48464* (2013.01); *H01L 2224/73265* (2013.01)

(58) Field of Classification Search
CPC . H01L 29/872; H01L 29/7783; H01L 29/778; H01L 29/66143; H01L 29/66462; H01L 29/66318
USPC ................... 257/194, 195, 476; 438/167, 172
See application file for complete search history.

(56) References Cited

U.S. PATENT DOCUMENTS

| | | | |
|---|---|---|---|
| 7,915,645 B2 * | 3/2011 | Briere | 257/195 |
| 2010/0117095 A1 * | 5/2010 | Zhang | 257/76 |
| 2014/0367744 A1 * | 12/2014 | Briere | 257/195 |

OTHER PUBLICATIONS

Soenmez et al. "Gallium Nitride for 600V Operation." 2011 Power Electronics Europe, Issue 4. pp. 25-28.
Chung et al. "Seamless On-Wafer Integration of Si(100) MOSFETs and GaN HEMTs." IEE Electron Device Letters, vol. 30, No. 10. IEEE, Oct. 2009. pp. 1015-1017.

\* cited by examiner

*Primary Examiner* — Minh-Loan Tran
(74) *Attorney, Agent, or Firm* — Murphy, Bilak & Homiller, PLLC

(57) ABSTRACT

An embodiment of a cascaded diode having a breakdown voltage exceeding 300V includes an HEMT and a Si Schottky diode. The HEMT includes a gate, a drain, a source, and a two-dimensional electron gas channel region connecting the source and the drain and controlled by the gate. The HEMT has a breakdown voltage exceeding 300V. The Si Schottky diode is monolithically integrated with the HEMT. The Si Schottky diode includes a cathode connected to the source of the HEMT and an anode connected to the gate of the HEMT. The Si Schottky diode has a breakdown voltage less than 300V and a forward voltage less than or equal to 0.4V. The anode of the Si Schottky diode forms the anode of the cascaded diode and the drain of the HEMT forms the cathode of the cascaded diode.

20 Claims, 10 Drawing Sheets

HIGH-VOLTAGE CASCADED DIODE WITH HEMT AND MONOLITHICALLY INTEGRATED SEMICONDUCTOR DIODE

TECHNICAL FIELD

The instant application relates to high-voltage diodes, and more particularly to high-voltage diodes formed from a low-voltage silicon-based diode cascaded with an HEMT on the same die.

BACKGROUND

The highest performance Si power diodes are Si Schottky diodes. Si Schottky diodes have low reverse recovery time compared to other types of Si power diodes, and also have the lowest forward voltage drop (0.4V to 0.3V). While Si Schottky diodes have the advantage of low forward losses and negligible switching losses compared to other diode technologies, the narrow bandgap of silicon limits their use to a maximum voltage of around 200 V. Power diodes with a breakdown voltage significantly above 200V have been realized by cascading a low-voltage Si Schottky diode with a high-voltage AlGaN/GaN HEMT (high electron mobility transistor). Such a cascaded diode has the low threshold voltage benefit of a Si Schottky diode and the high current density benefit of GaN.

The functionality of the cascaded diode is given by the Si Schottky diode causing a potential increase in the reverse direction until pinch-off of the high-voltage HEMT (the HEMT is a normally-on device in this case). Without this minimum bias on the cathode side of the Si Schottky diode, the high-voltage HEMT is switched on. As such, the overall switching speed of the cascaded diode can benefit from the high-voltage HEMT and from the fast Si Schottky diode. However, conventional cascaded diodes implement the low-voltage Si Schottky diode and the high-voltage HEMT on two separate dies (chips), one die including the high-voltage GaN HEMT and the other die include the low-voltage Si Schottky diode. The two dies are combined via a common package including bonding or clip connections between the dies. These connections in the package cause unwanted parasitic inductances and capacitances which degrade the dynamic behavior of the overall cascade circuit.

SUMMARY

According to an embodiment of a cascaded diode, the cascaded driver comprises a semiconductor diode, a III-nitride semiconductor body and an HEMT having a gate, a drain, a source, and a channel connecting the source and the drain. The channel of the HEMT is controlled by the gate and formed by a junction between two materials of the III-nitride semiconductor body with different band gaps. The semiconductor diode is monolithically integrated with the HEMT. The semiconductor diode has a cathode connected to the source of the HEMT and an anode connected to the gate of the HEMT. The anode of the semiconductor diode forms the anode of the cascaded diode, and the drain of the HEMT forms the cathode of the cascaded diode.

According to an embodiment of a cascaded diode having a breakdown voltage exceeding 300V, the cascaded driver comprises an HEMT including a gate, a drain, a source, and a two-dimensional electron gas channel region connecting the source and the drain and controlled by the gate. The HEMT has a breakdown voltage exceeding 300V. The cascaded driver further comprises a Si Schottky diode monolithically integrated with the HEMT, the Si Schottky diode including a cathode connected to the source of the HEMT and an anode connected to the gate of the HEMT. The Si Schottky diode has a breakdown voltage less than 300V and a forward voltage less than or equal to 0.4V. The anode of the Si Schottky diode forms the anode of the cascaded diode, and the drain of the HEMT forms the cathode of the cascaded diode.

According to an embodiment of a method of manufacturing a cascaded diode, the method comprises: forming an HEMT in a III-nitride semiconductor body, the HEMT having a gate, a drain, a source, and a channel connecting the source and the drain, the channel controlled by the gate and formed by a junction between two materials of the III-nitride semiconductor body with different band gaps; monolithically integrating a semiconductor diode with the HEMT, the semiconductor diode having a cathode connected to the source of the HEMT and an anode connected to the gate of the HEMT; connecting an anode terminal of the cascaded diode to the anode of the semiconductor diode; and connecting a cathode terminal of the cascaded diode to the drain of the HEMT.

Those skilled in the art will recognize additional features and advantages upon reading the following detailed description, and upon viewing the accompanying drawings.

BRIEF DESCRIPTION OF THE DRAWINGS

The components in the figures are not necessarily to scale, emphasis instead being placed upon illustrating the principles of the invention. Moreover, in the figures, like reference numerals designate corresponding parts. In the drawings.

DETAILED DESCRIPTION

Figure 1:
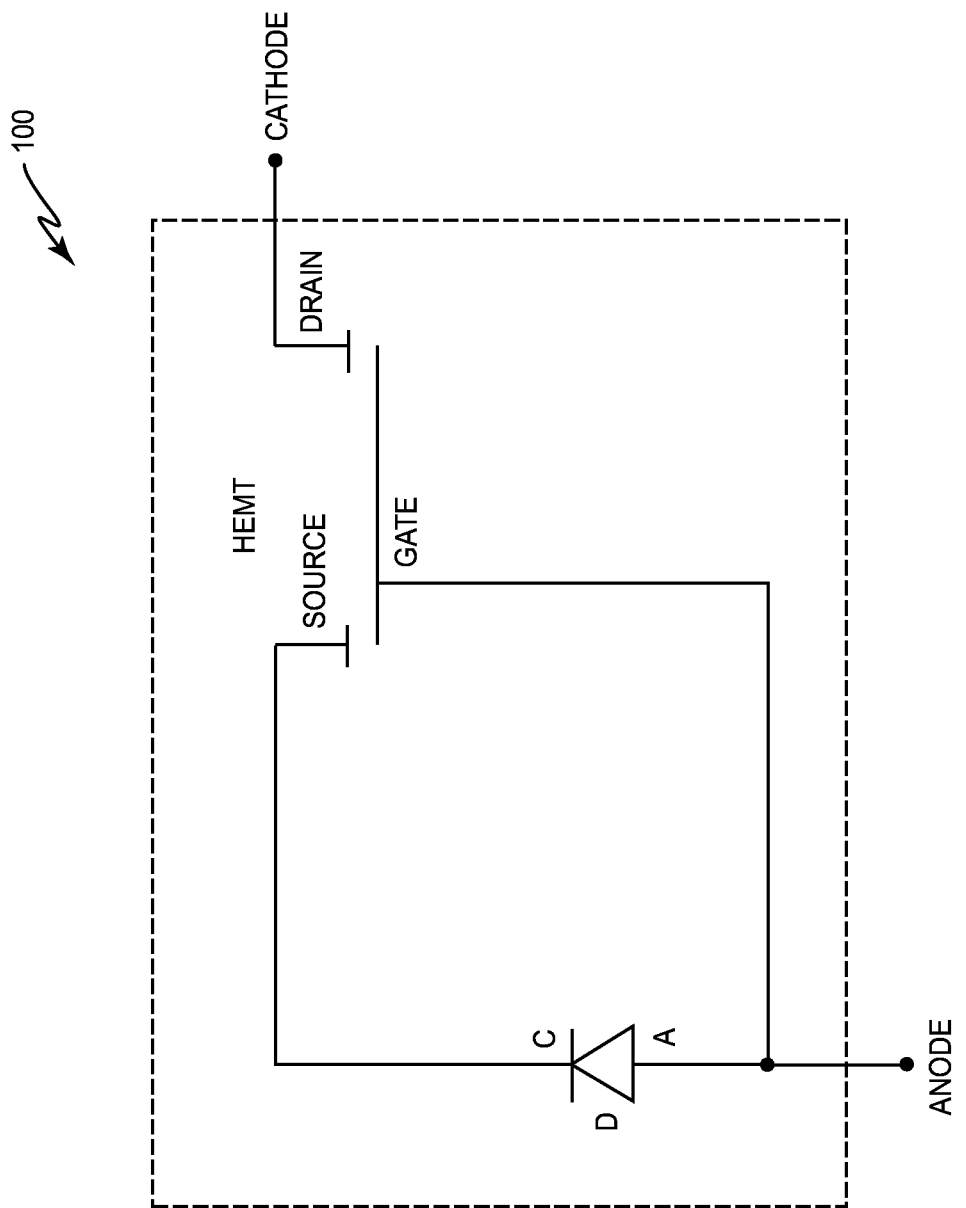
FIG. 1 illustrates a schematic diagram of a cascaded diode which includes a semiconductor Schottky diode monolithically integrated with an HEMT on the same die.

FIG. 1 illustrates a schematic diagram of a cascaded diode 100. The cascaded diode 100 includes an HEMT and a semiconductor diode (D) monolithically integrated with the HEMT on the same die, as indicated by the dashed box in FIG. 1. The cathode (C) of the semiconductor diode is connected to the source (S) of the HEMT and the anode (A) of the semiconductor diode is connected to the gate (G) of the HEMT. The anode of the semiconductor diode forms the anode ('Anode') of the cascaded diode 100 and the drain (D) of the HEMT forms the cathode ('Cathode') of the cascaded diode 100. Such a monolithically integrated construction yields a cascaded diode 100 having the low threshold voltage benefit of a semiconductor diode and the high current density and high breakdown voltage benefits of an HEMT, while eliminating unwanted parasitic package inductances and capacitances which would otherwise degrade the dynamic behavior of the cascaded diode 100.

In general, the HEMT can be realized using any suitable III-nitride technology such as GaN. The semiconductor diode can be formed using the same or different semiconductor technology as the HEMT. For example in the case of the HEMT having an AlGaN barrier region and a GaN buffer region, the semiconductor diode can be a GaN diode or a MIS (metal insulator semiconductor) gated diode. In the case of a MIS-gated diode, the MIS-gated diode is based on a normally-off HEMT design (e.g. a gate recess is performed to obtain normally off conditions). However, the gate of the MIS-gated diode is electrically connected to the source of the diode which forms the anode. This way, the MIS-gated diode conducts current when a reverse voltage between the source (anode) and the drain (cathode) of the MIS-gated diode exceeds the threshold voltage of the diode. The threshold voltage of the MIS-gated diode can be less than the threshold voltage of the HEMT. The channel opens under the gate electrode of the MIS-gated diode in the reverse direction when the potential at the drain with respect to the source is a small negative voltage. In III-V semiconductors, the insulator of the MIS-gated diode can be a nitride instead of an oxide.

Alternatively, the semiconductor diode can be a silicon-based diode such as a Si Schottky diode or a Si p-n junction diode. In yet another embodiment, the semiconductor diode can be a SiC Schottky diode. Si and SiC technologies can be readily integrated with III-nitride technologies such as GaN to form the cascaded diode 100 that includes a semiconductor diode monolithically integrated with an HEMT on the same die, as described in more detail later herein.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form the channel. The compound semiconductor device may have AlInN/AlN/GaN barrier/spacer/buffer layer structures.

Specifically with regard to GaN technology, the presence of polarization charges and strain effects result in the realization of a two-dimensional charge carrier gas which is a two-dimensional electron or hole inversion layer characterized by very high carrier density and carrier mobility. Such a two-dimensional charge carrier gas, such as a 2DEG (two-dimensional electron gas) or 2DHG (two-dimensional hole gas), forms a conductive channel region of the HEMT near the interface between, e.g., a GaN alloy barrier region and a GaN buffer region. A thin, e.g. 1-2 nm, AlN layer can be provided between the GaN buffer region and the GaN alloy barrier region to minimize alloy scattering and enhance 2DEG mobility. In a broad sense, the HEMTs described herein can be formed from any binary, ternary or quaternary III-nitride compound semiconductor material where a band discontinuity is responsible for the device concept.

Figure 2:
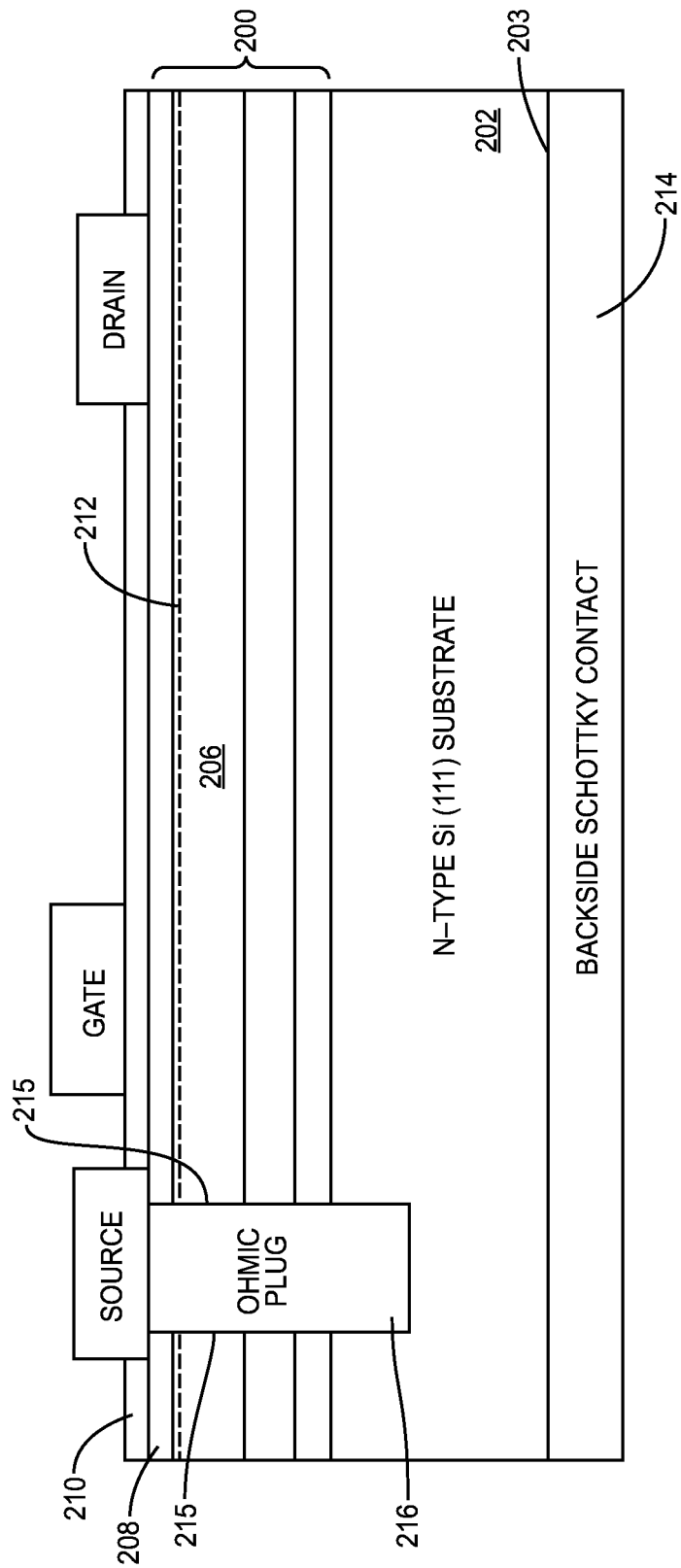
FIG. 2 illustrates a partial cross-sectional view of an embodiment of a cascaded diode which includes a vertical Si Schottky diode monolithically integrated with an HEMT on the same die.

FIG. 2 illustrates a partial cross-sectional view of an embodiment of a die which includes the high-voltage cascaded diode 100. The die includes an HEMT disposed in a III-nitride semiconductor body 200. The HEMT has a gate ('Gate'), a source ('Source'), and a drain ('Drain'). The gate, source, and drain regions of the HEMT can comprise doped regions, e.g. silicon-doped regions in GaN-based III-nitride materials to yield n-type doping, metal regions, or a combination of doped and metal regions. Formation of gate, source, and drain regions of HEMTs is well known in the semiconductor arts, and therefore no further explanation is provided in this regard.

The III-nitride semiconductor body 200 is disposed on a Si substrate 202 with a (111) crystal orientation according to this embodiment. One or more transition layers 204 such as AlN are formed on the Si substrate 202. A buffer region 206 such as GaN is formed on the one or more transition layers 204, a barrier region 208 such as a GaN alloy like AlGaN or InGaN is formed on the buffer region 206, and a passivation layer 210 such as SiN is formed on the barrier region 208. The barrier and buffer regions 206, 208 comprise materials of the III-nitride semiconductor body 200 with different band gaps and therefore give rise to a 2DEG or 2DHG channel 212 of the HEMT as previously explained herein, depending on the material types. The channel 212 connects the source and the drain of the HEMT, and is controlled by the gate. In this embodiment, the HEMT is normally-on i.e. a negative gate voltage must be applied to the gate to disrupt the channel 212 under the gate and turn off the HEMT. In general, any suitable binary, ternary or quaternary III-nitride compound semiconductor layers 204, 206, 208 can be formed on the Si substrate 202 for device fabrication purposes. Formation of such III-nitride compound semiconductor layers 204, 206, 208 on a growth substrate such as a Si substrate 202 is well known in the semiconductor arts, and therefore no further explanation is provided in this regard.

The cascaded diode die further includes a semiconductor diode monolithically integrated with the HEMT on the same die. In this embodiment, the semiconductor diode is formed using a different semiconductor technology than the HEMT. Particularly, the Si substrate 202 is doped n-type and a metallization 214 is disposed on a side 203 of the Si substrate 202 facing away from the III-nitride semiconductor body 200. The semiconductor diode is a Si Schottky diode according to this embodiment. The cathode of the Si Schottky diode is formed by the n-type doped Si substrate 202 and the anode of the Si Schottky diode is formed by the metallization 214 disposed on the backside 203 of the Si substrate 202. As such, the backside metallization 214 forms a Schottky contact.

An electrically conductive ohmic plug ('Ohmic Plug') 216 extends through the III-nitride semiconductor body 200 and connects the source of the HEMT to the Si substrate 202. The plug 216 can be made of metal or polysilicon, and formed by etching an opening through the III-nitride semiconductor body 200 to the Si substrate 202 and filling the opening. The plug 216 can have insulated sidewalls 215 to isolate the conductive part of the plug 216 from the adjacent semiconductor material 200. The plug 216 completes the cascaded connection between the source of the HEMT and the cathode of the semiconductor diode.

Alternatively, a SiC substrate can be used instead of the Si substrate 202 and the semiconductor diode can be a SiC Schottky diode instead of a Si Schottky diode. In yet another embodiment, the semiconductor diode can be a GaN diode or a MIS-gated diode formed in the same III-nitride semiconductor body 200 as the HEMT. In each case, the anode of the semiconductor diode forms the anode of the high-voltage cascaded diode and the drain of the HEMT forms the cathode of the high-voltage cascaded diode as shown in FIG. 1.

The cascaded diode die can be manufactured by forming the III-nitride semiconductor body 200 on miscut Si(100) or Si(110) substrates instead of a Si(111) substrate, by molecular beam epitaxy and metalorganic vapor phase epitaxy. Alternatively, a pre-grown GaN epilayer can be transferred onto a Si(100) substrate through the removal of the original substrate and subsequent bonding to the Si(100) substrate e.g. via an Au/In/Au bonding layer, a PdIn3 and AuGe interlayer, or an SiO2 interlayer. In yet another embodiment, a substrate comprising Si(100) and GaN can be formed through a substrate bonding and etch-back process. In general, such techniques and others can be used to realize a semiconductor diode monolithically integrated with an HEMT on the same die to form a high-voltage cascaded diode.

In the case of a GaN diode monolithically integrated with the HEMT to realize the cascaded diode of FIG. 1 on the same die, the forward voltage of the semiconductor diode is about 1V to 0.8V. In the case of a MIS-gated diode monolithically integrated with the HEMT to realize the cascaded diode of FIG. 1 on the same die, the forward voltage of the semiconductor diode can be less than 0.8V. Performance of the cascaded diode can be increased by using a Si p-n junction diode or a SiC Schottky each of which has a forward voltage of about 0.7V to 0.6V. The performance of the cascaded diode can be even further increased by using a Si Schottky diode which has a forward voltage of about 0.4V or less. Si Schottky diodes have a breakdown voltage less than 300V e.g. typically 200V or less. In contrast, the HEMT monolithically integrated with the semiconductor diode has a breakdown voltage exceeding 300V. For example, in the case of a lateral GaN HEMT as shown in FIG. 2, the lateral HEMT can have a breakdown voltage of about 600V or even greater. Vertical or quasi-vertical HEMTs can be used, but have a lower breakdown voltage owing to a thinner drift region.

Figure 3:
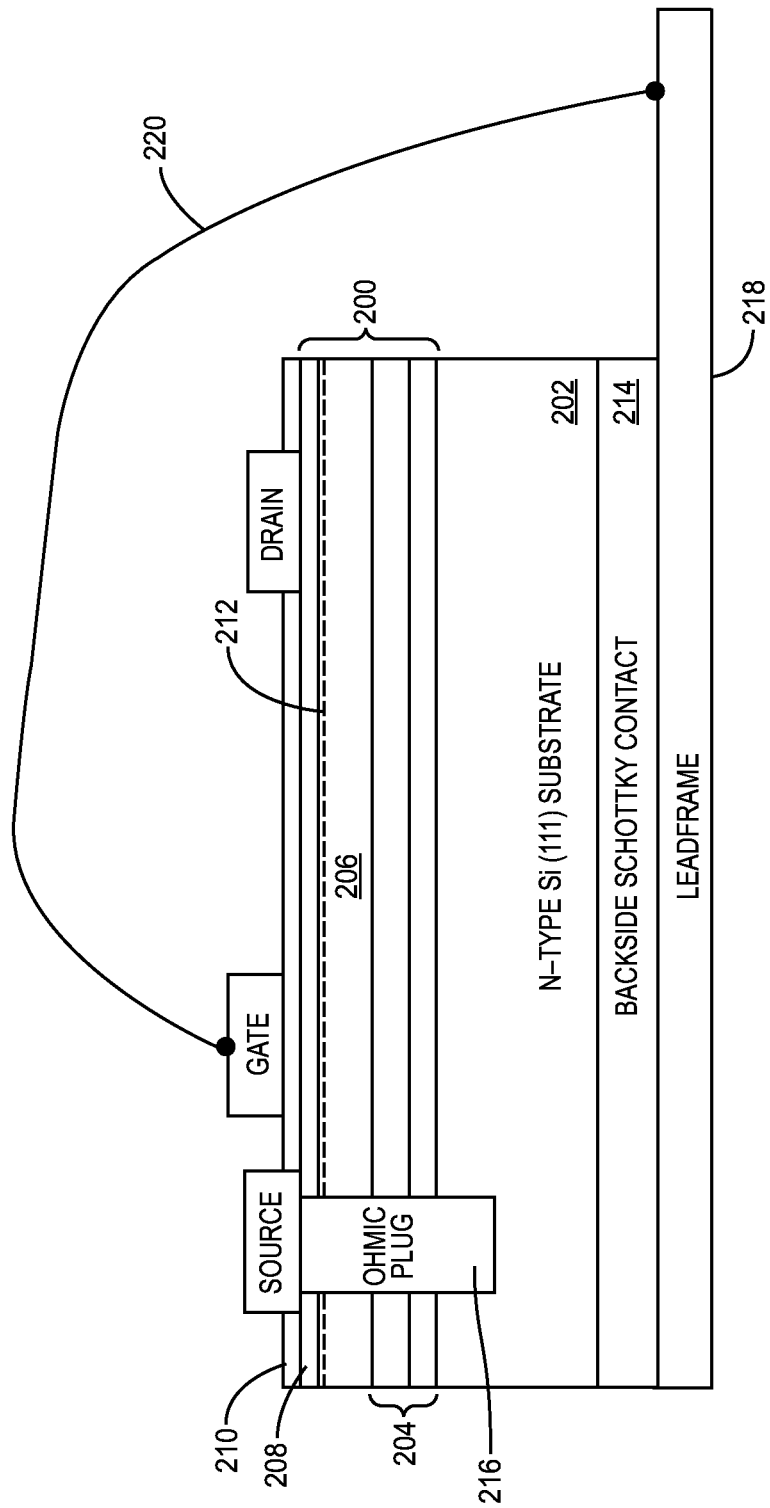
FIG. 3 illustrates a partial cross-sectional view of another embodiment of a cascaded diode which includes a vertical Si Schottky diode monolithically integrated with an HEMT on the same die.

FIG. 3 illustrates a partial cross-sectional view of the die shown in FIG. 2 with the gate of the HEMT connected to a leadframe 218 by a bond wire, ribbon or clip 220. The leadframe 218 has a conductive pathway for completing the electrical connection to the anode of the semiconductor diode i.e. the backside metallization 214, forming the cascaded diode connection shown in FIG. 1.

Figure 4:
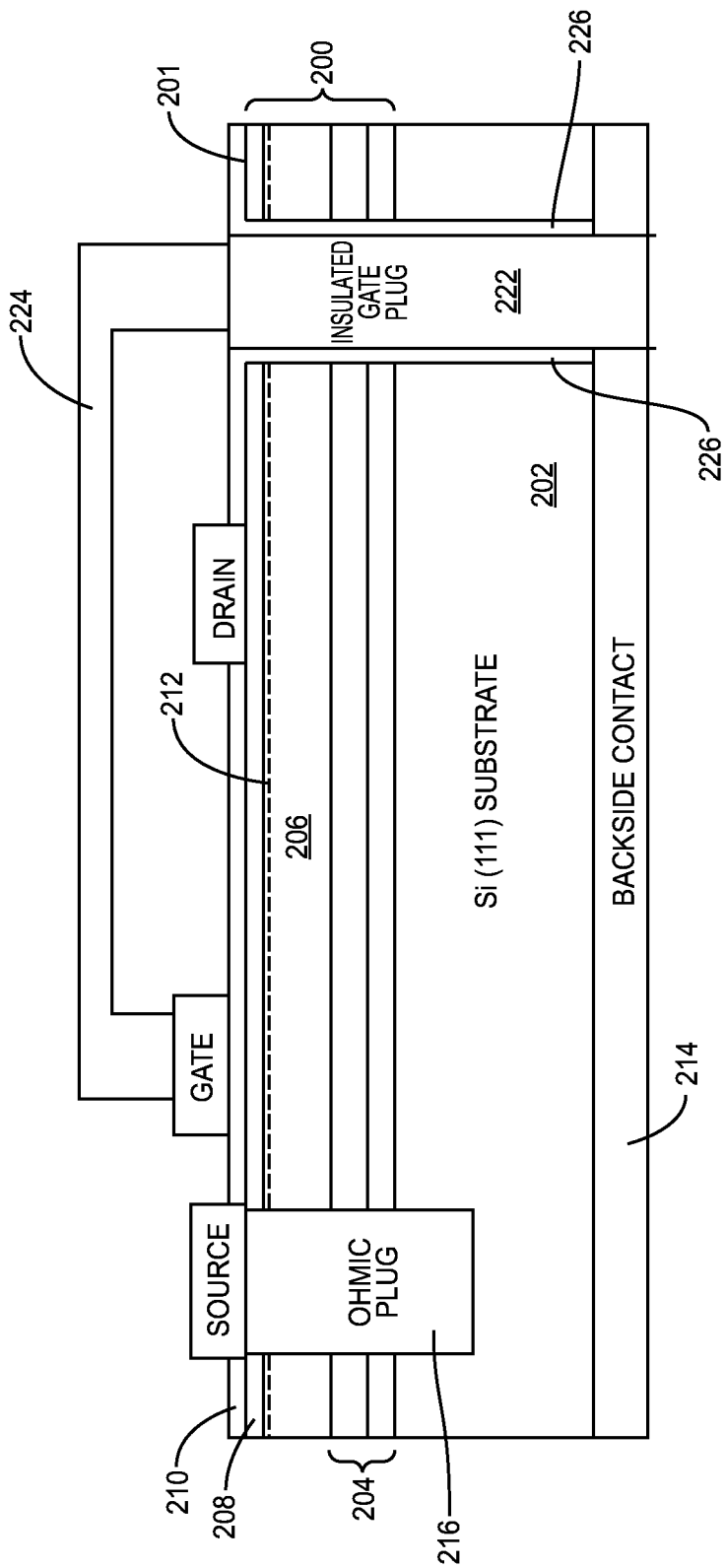
FIG. 4 illustrates a partial cross-sectional view of yet another embodiment of a cascaded diode which includes a vertical Si Schottky diode monolithically integrated with an HEMT on the same die.

FIG. 4 illustrates a partial cross-sectional view of the die shown in FIG. 2 with the gate of the HEMT connected to the anode of the semiconductor diode i.e. the backside metallization 214 via an electrically conductive plug 222. The plug 222 extends through the III-nitride semiconductor body 200 and the Si substrate 202 to the backside metallization 214, and connects the gate of the HEMT to the anode of the semiconductor diode via a metal layer or clip 224 disposed at the front-side 201 of the die. The electrically conductive plug 222 has insulated sidewalls 226 to insulate the plug 222 from the adjacent semiconductor material 200, 202.

Figure 5:
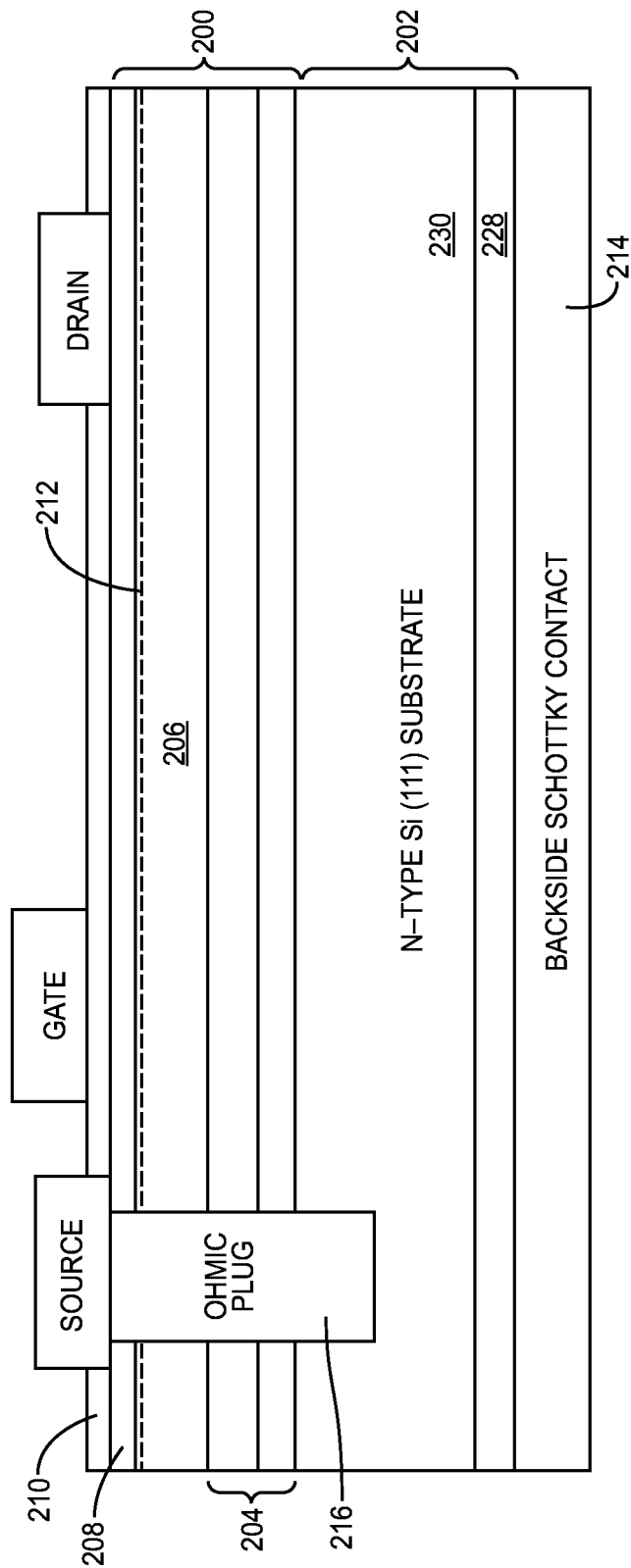
FIG. 5 illustrates a partial cross-sectional view of still another embodiment of a cascaded diode which includes a vertical Si Schottky diode monolithically integrated with an HEMT on the same die.

FIG. 5 illustrates a partial cross-sectional view of another embodiment of a die with a high-voltage cascaded diode. The embodiment shown in FIG. 5 is similar to the embodiment shown in FIG. 2, however the n-type doping concentration of the Si substrate 202 in FIG. 5 is lower in a first region 228 of the Si substrate 202 adjacent the backside metallization 214 and higher in a second region 230 of the Si substrate 202 spaced apart from the backside metallization 214 by the first (more lightly doped) region 228. For example, the more highly doped region 230 of the Si substrate 202 can have a doping concentration of $10^{17}$ to $10^{20}$ $cm^{-3}$ and the more lightly doped region 228 of the Si substrate 202 can have a doping concentration of $10^{14}$ to $10^{16}$ $cm^{-3}$. The more lightly doped region 228 can be formed by a backside epitaxial process on the more highly doped region 230. In general, such a construction results in a better Schottky interface between the backside metallization 214 and the Si substrate 202.

Figure 6:
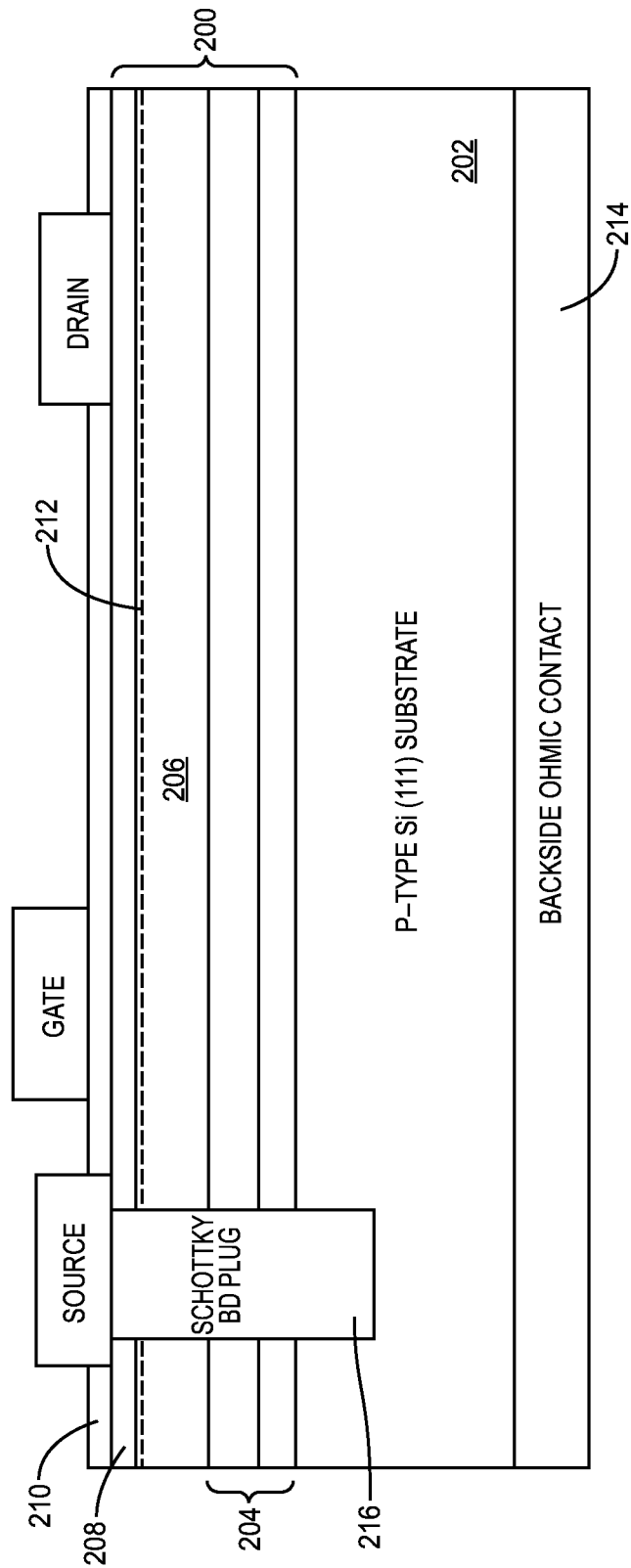
FIG. 6 illustrates a partial cross-sectional view of another embodiment of a cascaded diode which includes a vertical Si Schottky diode monolithically integrated with an HEMT on the same die.

FIG. 6 illustrates a partial cross-sectional view of yet another embodiment of a die with a high-voltage cascaded diode. The embodiment shown in FIG. 6 is similar to the embodiment shown in FIG. 2, however the Si substrate 202 is p-type instead of n-type. In case of such a p-type substrate 202, the Schottky contact is at the HEMT-source side in order for the cascaded diode to function as illustrated in FIG. 1. Hence the Schottky contact can be established using a metal plug ('Schottky BD Plug') 216 in connection with the p-type Si substrate 202. The backside metallization 214 is Ohmic according to this embodiment, so that the cathode of the Si Schottky diode is formed by the metal plug 216 and the anode of the diode is formed by the p-type doped Si substrate 202.

Figure 7:
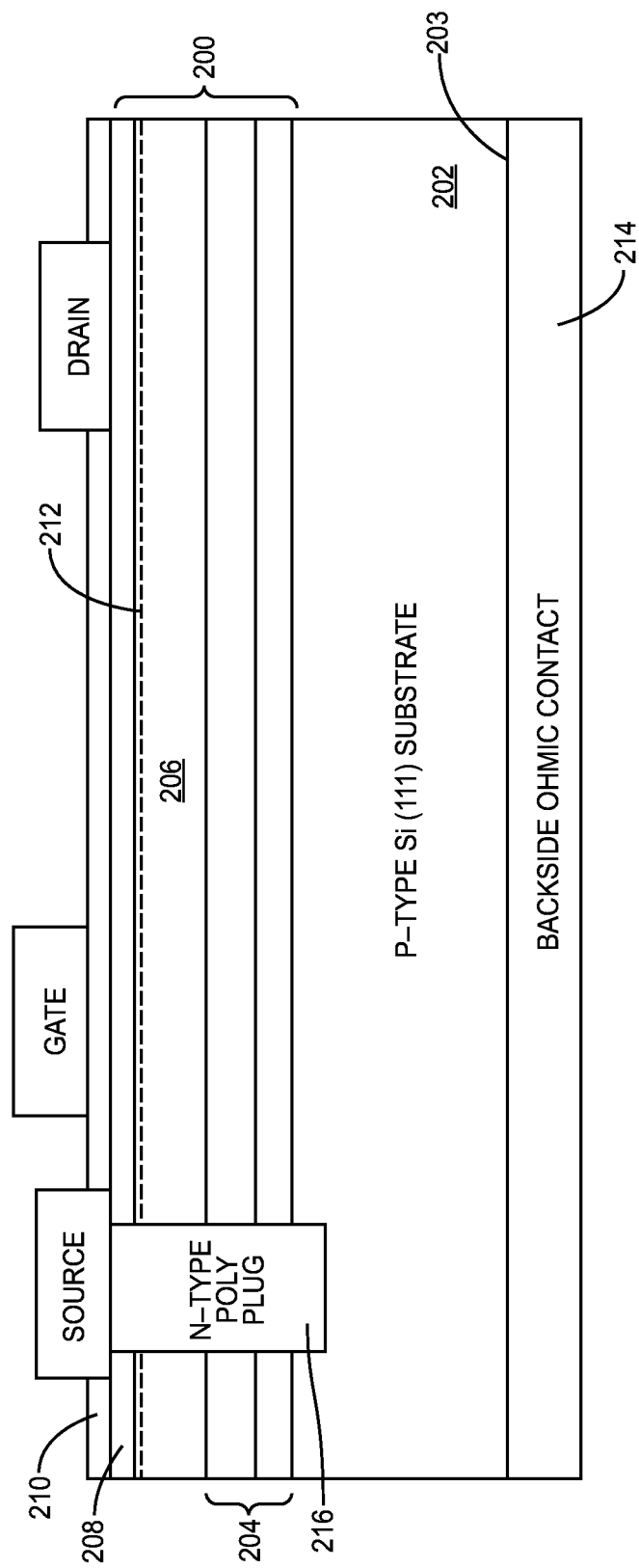
FIG. 7 illustrates a partial cross-sectional view of an embodiment of a cascaded diode which includes a vertical Si p-n junction diode monolithically integrated with an HEMT on the same die.

FIG. 7 illustrates a partial cross-sectional view of still another embodiment of a die with a high-voltage cascaded diode. The embodiment shown in FIG. 7 is similar to the embodiment shown in FIG. 6, however the plug ('n-type Poly Plug') 216 connecting the source of the HEMT to the p-type Si substrate 202 comprises n-doped polysilicon. According to this embodiment, the semiconductor diode is a Si p-n junction diode. The cathode of the Si p-n junction diode is formed by the n-doped polysilicon plug 216 and the anode of the Si p-n junction diode is formed by the p-type doped Si substrate 202. The limited backward depletion of the poly-based p-n junction requires a sufficiently high threshold (Vth) voltage (i.e. Vth<0) to maintain the cascade functionality. Alternatively, the p-n junction can be implemented at the wafer backside 203 instead of partly in the plug 216.

Figure 8:
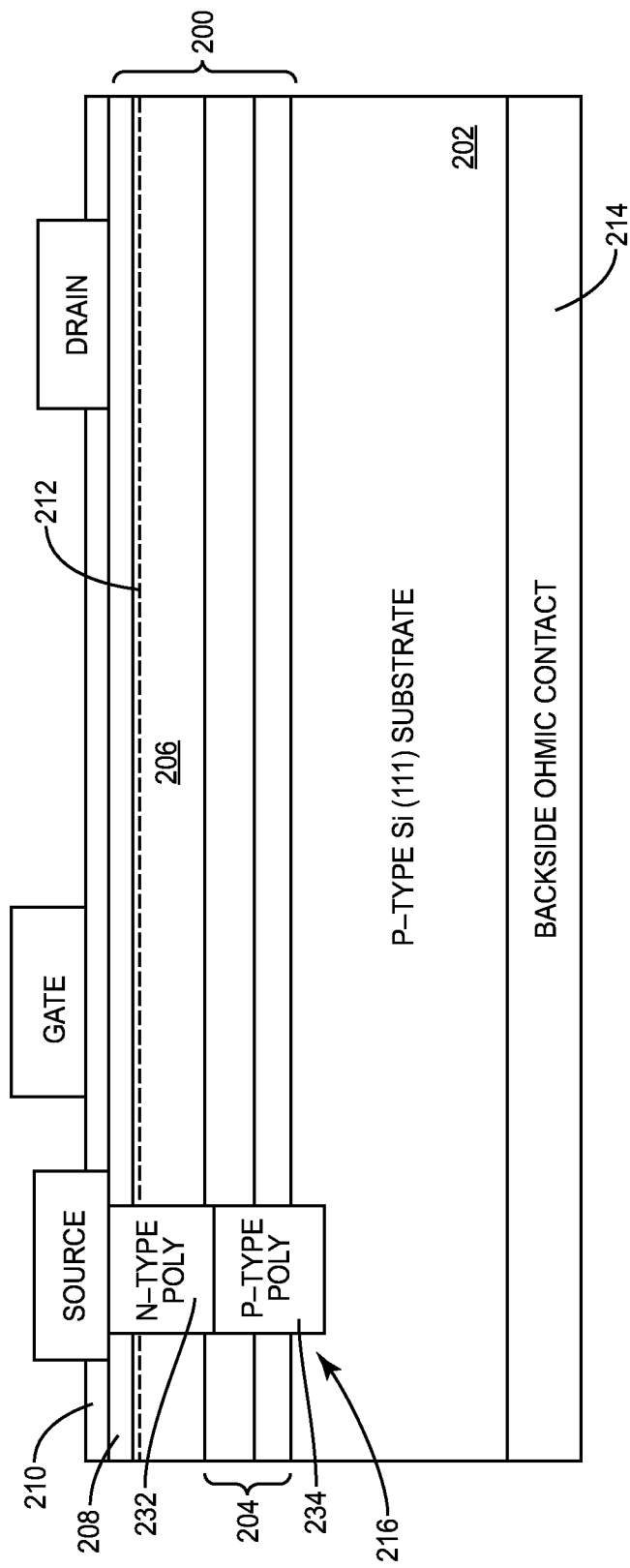
FIG. 8 illustrates a partial cross-sectional view of another embodiment of a cascaded diode which includes a vertical Si p-n junction diode monolithically integrated with an HEMT on the same die.

FIG. 8 illustrates a partial cross-sectional view of another embodiment of a die with a high-voltage cascaded diode. The embodiment shown in FIG. 8 is similar to the embodiment shown in FIG. 7, however the Si p-n junction diode is formed entirely in the plug 216 which connects the source of the HEMT to the p-type Si substrate 202. According to this embodiment, the plug 216 comprises an n-doped polysilicon region ('n-type Poly') 232 contacting the source of the HEMT and a p-doped polysilicon region ('p-type Poly') 234 spaced apart from the source of the HEMT by the n-doped polysilicon region 232. The cathode of the Si p-n junction diode is formed by the n-doped polysilicon region 232 of the plug 216 and the anode of the Si p-n junction diode is formed by the p-type doped polysilicon region 234 of the plug 216.

The cascaded diode embodiments previously described herein utilize a vertical semiconductor diode that is monolithically integrated with an HEMT on the same die. Alternatively, a lateral semiconductor diode can be monolithically integrated with the HEMT on the same die. For example, lateral diode integration can be implemented using polysilicon deposition onto or beside the source and gate metal electrodes. The polysilicon can be deposited before or after formation of the source and gate metal electrodes. If the polysilicon is deposited prior to source and gate electrode formation, the polysilicon can be connected by a Schottky contact to the HEMT source and by an Ohmic contact to the HEMT gate.

Figure 9:
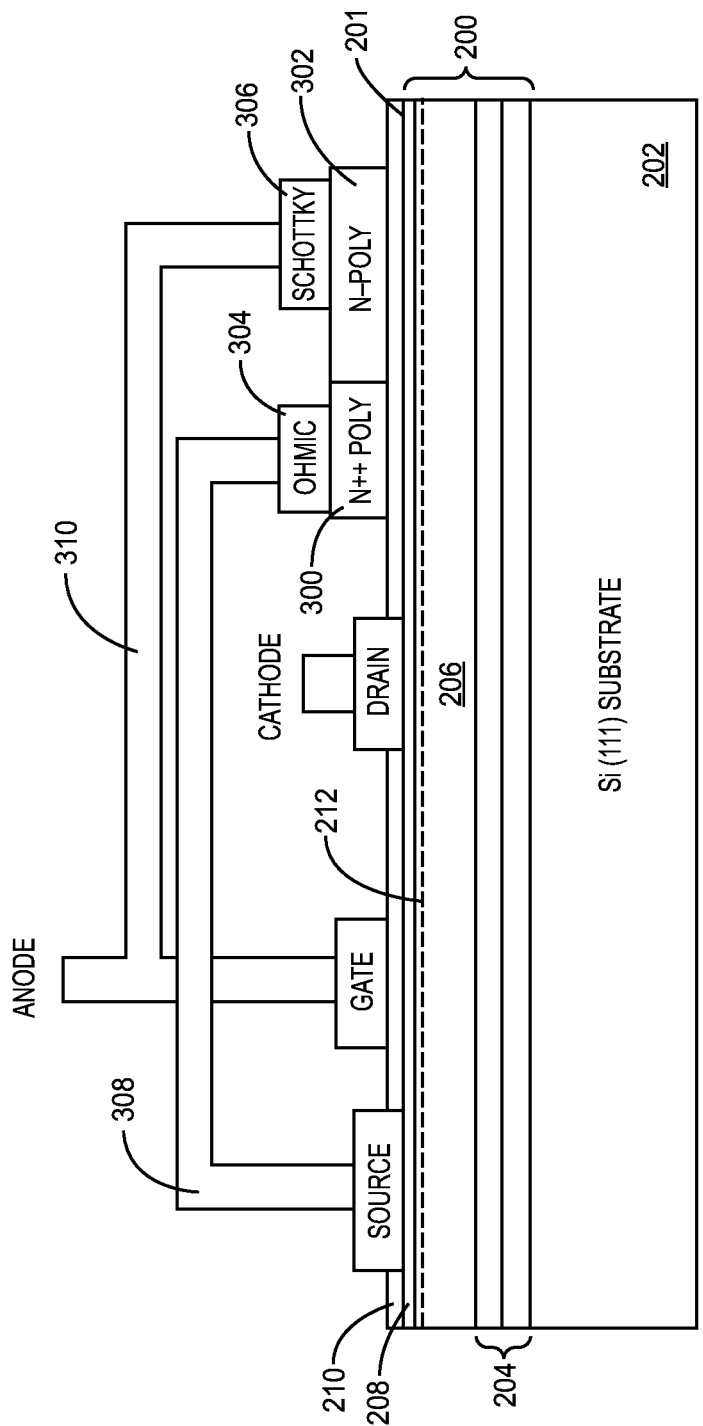
FIG. 9 illustrates a partial cross-sectional view of an embodiment of a cascaded diode which includes a lateral semiconductor diode monolithically integrated with an HEMT on the same die.

FIG. 9 illustrates a partial cross-sectional view of an embodiment of a lateral semiconductor diode monolithically integrated with an HEMT on the same die to form the high-voltage cascaded diode shown in FIG. 1. The lateral semiconductor diode is disposed on a side of the III-nitride semiconductor body 200 with the gate of the HEMT. The lateral semiconductor diode includes a heavily n-doped (n++) polysilicon region 300 disposed on the front-side 201 of the III-nitride semiconductor body 200, a lightly n-doped (n−) polysilicon region 302 adjacent the heavily n-doped polysilicon region 300, an ohmic contact 304 on the heavily n-doped polysilicon region 300, and a Schottky contact 306 on the lightly n-doped polysilicon region 302. The heavily and lightly n-doped polysilicon regions 300, 302 can be formed by standard deposition, masking and doping processes, and thus no further explanation is given in this regard. The source of the HEMT is connected to the ohmic contact via a clip, bond wire, ribbon or other type of electrical connector 308, and the gate of the HEMT is connected to the Schottky contact 306 via another clip, bond wire, ribbon or other type of electrical connector 310 to complete the cascaded connection shown in FIG. 1. The anode and cathode of the resulting cascaded diode are labeled 'Anode' and 'Cathode', respectively, in FIG. 9.

Figure 10:
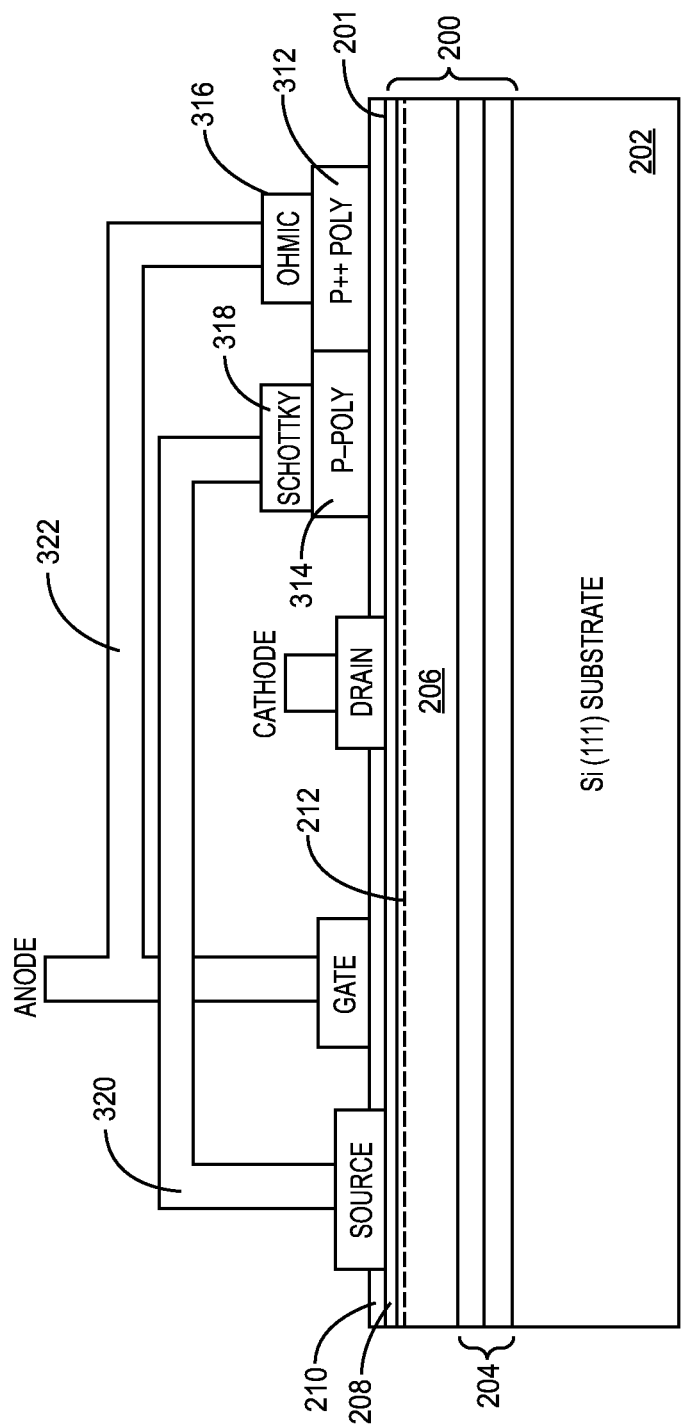
FIG. 10 illustrates a partial cross-sectional view of another embodiment of a cascaded diode which includes a lateral semiconductor diode monolithically integrated with an HEMT on the same die.

FIG. 10 illustrates a partial cross-sectional view of another embodiment of a lateral semiconductor diode monolithically integrated with an HEMT on the same die to form the high-voltage cascaded diode shown in FIG. 1. The lateral semiconductor diode includes a heavily p-doped (p++) polysilicon region 312 disposed on the front-side 201 of the III-nitride semiconductor body 200, a lightly p-doped polysilicon region 314 adjacent the heavily n-doped polysilicon region 312, an ohmic contact 316 on the heavily p-doped polysilicon region 312, and a Schottky contact 318 on the lightly p-doped polysilicon region 314. The heavily and lightly p-doped polysilicon regions 312, 314 can be formed by standard deposition, masking and doping processes, and thus no further explanation is given in this regard. The source of the HEMT is connected to the Schottky contact 318 via a clip, bond wire, ribbon or other type of electrical connector 320, and the gate of the HEMT is connected to the ohmic contact 316 via another clip, bond wire, ribbon or other type of electrical connector 322 to complete the cascaded connection shown in FIG. 1. The anode and cathode of the resulting cascaded diode are labeled 'Anode' and 'Cathode', respectively, in FIG. 9.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A cascaded diode, comprising:
a III-nitride semiconductor body;
an HEMT having a gate, a drain, a source, and a channel connecting the source and the drain, the channel controlled by the gate and formed by a junction between two materials of the III-nitride semiconductor body with different band gaps; and
a semiconductor diode monolithically integrated with the HEMT, the semiconductor diode having a cathode connected to the source of the HEMT and an anode connected to the gate of the HEMT,
wherein the anode of the semiconductor diode forms the anode of the cascaded diode and the drain of the HEMT forms the cathode of the cascaded diode.

2. The cascaded diode of claim 1, wherein the semiconductor diode is a Si Schottky diode or a SiC Schottky diode.

3. The cascaded diode of claim 1, wherein the semiconductor diode is a Si p-n junction diode.

4. The cascaded diode of claim 1, wherein the HEMT is a GaN HEMT and the semiconductor diode is a GaN diode or a MIS-gated diode.

5. The cascaded diode of claim 1, further comprising:
a Si substrate on which the III-nitride semiconductor body is disposed; and
an electrically conductive plug extending through the III-nitride semiconductor body and connecting the source of the HEMT to the Si substrate.

6. The cascaded diode of claim 5, further comprising a metallization disposed on a side of the Si substrate facing away from the III-nitride semiconductor body, wherein the Si substrate is doped n-type, the cathode of the semiconductor diode is formed by the n-type doped Si substrate and the anode of the semiconductor diode is formed by the metallization disposed on the Si substrate.

7. The cascaded diode of claim 6, wherein the concentration of the n-type doping of the Si substrate is lower in a first region of the Si substrate adjacent the metallization and higher in a second region of the Si substrate spaced apart from the metallization by the first region.

8. The cascaded diode of claim 5, wherein the Si substrate is doped p-type, the plug is a metal plug, the cathode of the semiconductor diode is formed by the metal plug and the anode of the semiconductor diode is formed by the p-type doped Si substrate.

9. The cascaded diode of claim 5, wherein the Si substrate is doped p-type, the plug comprises n-doped polysilicon, the cathode of the semiconductor diode is formed by the n-doped polysilicon plug and the anode of the semiconductor diode is formed by the p-type doped Si substrate.

10. The cascaded diode of claim 5, wherein the plug comprises an n-doped polysilicon region contacting the source of the HEMT and a p-doped polysilicon region spaced apart from the source of the HEMT by the n-doped polysilicon region, the cathode of the semiconductor diode is formed by the n-doped polysilicon region of the plug and the anode of the semiconductor diode is formed by the p-type doped polysilicon region of the plug.

11. The cascaded diode of claim 1, wherein the semiconductor diode is disposed on the III-nitride semiconductor body and comprises:
   a heavily n-doped polysilicon region disposed on the side of the III-nitride semiconductor body with the gate of the HEMT;
   a lightly n-doped polysilicon region adjacent the heavily n-doped polysilicon region;
   an ohmic contact on the heavily n-doped polysilicon region; and
   a Schottky contact on the lightly n-doped polysilicon region,
   wherein the source of the HEMT is connected to the ohmic contact and the gate of the HEMT is connected to the Schottky contact.

12. The cascaded diode of claim 1, wherein the semiconductor diode is disposed on the III-nitride semiconductor body and comprises:
   a heavily p-doped polysilicon region disposed on the side of the III-nitride semiconductor body with the gate of the HEMT;
   a lightly p-doped polysilicon region adjacent the heavily n-doped polysilicon region;
   an ohmic contact on the heavily p-doped polysilicon region; and
   a Schottky contact on the lightly p-doped polysilicon region,
   wherein the source of the HEMT is connected to the Schottky contact and the gate of the HEMT is connected to the ohmic contact.

13. The cascaded diode of claim 1, further comprising an electrically conductive plug extending through the III-nitride semiconductor body for connecting the gate of the HEMT to the anode of the semiconductor diode, the electrically conductive plug having insulated sidewalls.

14. A cascaded diode having a breakdown voltage exceeding 300V, comprising:
   an HEMT including a gate, a drain, a source, and a two-dimensional electron gas channel region connecting the source and the drain and controlled by the gate, the HEMT having a breakdown voltage exceeding 300V; and
   a Si Schottky diode monolithically integrated with the HEMT, the Si Schottky diode including a cathode connected to the source of the HEMT and an anode connected to the gate of the HEMT, the Si Schottky diode having a breakdown voltage less than 300V and a forward voltage less than or equal to 0.4V,
   wherein the anode of the Si Schottky diode forms the anode of the cascaded diode and the drain of the HEMT forms the cathode of the cascaded diode.

15. The cascaded diode of claim 14, further comprising:
   a Si substrate on which the HEMT is disposed; and
   an electrically conductive plug connecting the source of the HEMT to the Si substrate.

16. The cascaded diode of claim 15, further comprising a metallization disposed on a side of the Si substrate facing away from the gate of the HEMT, wherein the Si substrate is doped n-type, the cathode of the Si Schottky diode is formed by the n-type doped Si substrate and the anode of the Si Schottky diode is formed by the metallization disposed on the Si substrate.

17. The cascaded diode of claim 15, wherein the Si substrate is doped p-type, the plug is a metal plug, the cathode of the Si Schottky diode is formed by the metal plug and the anode of the Si Schottky diode is formed by the p-type doped Si substrate.

18. The cascaded diode of claim 14, wherein the Si Schottky diode is disposed on a side of a III-nitride semiconductor body with the gate of the HEMT and the Si Schottky diode comprises:
   a heavily n-doped polysilicon region disposed on the side of the III-nitride semiconductor body with the gate of the HEMT;
   a lightly n-doped polysilicon region adjacent the heavily n-doped polysilicon region;
   an ohmic contact on the heavily n-doped polysilicon region; and
   a Schottky contact on the lightly n-doped polysilicon region,
   wherein the source of the HEMT is connected to the ohmic contact and the gate of the HEMT is connected to the Schottky contact.

19. The cascaded diode of claim 14, wherein the Si Schottky diode is disposed on a side of a III-nitride semiconductor body with the gate of the HEMT and the Si Schottky diode comprises:
   a heavily p-doped polysilicon region disposed on the side of the III-nitride semiconductor body with the gate of the HEMT;
   a lightly p-doped polysilicon region adjacent the heavily n-doped polysilicon region;
   an ohmic contact on the heavily p-doped polysilicon region; and
   a Schottky contact on the lightly p-doped polysilicon region,
   wherein the source of the HEMT is connected to the Schottky contact and the gate of the HEMT is connected to the ohmic contact.

20. A method of manufacturing a cascaded diode, the method comprising:
   forming an HEMT in a III-nitride semiconductor body, the HEMT having a gate, a drain, a source, and a channel connecting the source and the drain, the channel controlled by the gate and formed by a junction between two materials of the III-nitride semiconductor body with different band gaps;
   monolithically integrating a semiconductor diode with the HEMT, the semiconductor diode having a cathode connected to the source of the HEMT and an anode connected to the gate of the HEMT;
   connecting an anode terminal of the cascaded diode to the anode of the semiconductor diode; and
   connecting a cathode terminal of the cascaded diode to the drain of the HEMT.

* * * * *